United States Patent
Wooldridge et al.

(10) Patent No.: US 10,576,769 B2
(45) Date of Patent: Mar. 3, 2020

(54) DROP-ON-DEMAND IDENTIFICATION DOCUMENT PRINTING WITH SURFACE PRE-TREATMENT

(71) Applicant: Entrust Datacard Corporation, Shakopee, MN (US)

(72) Inventors: Cory Wooldridge, Shakopee, MN (US); Norbert Kill, Shakopee, MN (US); Lex Prenevost, Shakopee, MN (US); Brendan Hinnenkamp, Shakopee, MN (US); Jon Wawra, Shakopee, MN (US); Thomas Wagener, Shakopee, MN (US)

(73) Assignee: ENTRUST DATACARD CORPORATION, Shakopee, MN (US)

( * ) Notice: Subject to any disclaimer, the term of this patent is extended or adjusted under 35 U.S.C. 154(b) by 0 days.

(21) Appl. No.: 15/915,291

(22) Filed: Mar. 8, 2018

(65) Prior Publication Data
US 2018/0257416 A1  Sep. 13, 2018

Related U.S. Application Data

(60) Provisional application No. 62/468,522, filed on Mar. 8, 2017.

(51) Int. Cl.
*B41M 5/00* (2006.01)
*B41J 11/00* (2006.01)
*H01J 37/32* (2006.01)

(52) U.S. Cl.
CPC ........ *B41M 5/0011* (2013.01); *B41J 11/0015* (2013.01); *B41M 5/0047* (2013.01);
(Continued)

(58) Field of Classification Search
CPC .............. B41M 5/0011; B41M 5/0047; B41M 5/0064; B42D 25/23; B42D 25/40;
(Continued)

(56) References Cited

U.S. PATENT DOCUMENTS

| | | |
|---|---|---|
| 4,825,054 A | 4/1989 | Rust |
| 5,266,781 A | 11/1993 | Warwick |

(Continued)

FOREIGN PATENT DOCUMENTS

| | | |
|---|---|---|
| CN | 203957531 U | 11/2014 |
| WO | 2014184559 A1 | 11/2014 |

OTHER PUBLICATIONS

International Search Report and Written Opinion issued in PCT/US2018/021528, dated Jul. 2, 2018, total 15 pages.

(Continued)

*Primary Examiner* — Geoffrey S Mruk
(74) *Attorney, Agent, or Firm* — Hamre, Schumann, Mueller & Larson, P.C.

(57) ABSTRACT

A single plasma nozzle of a plasma treatment station is used to treat the card surface prior to performing drop-on-demand printing on the card surface. The single plasma nozzle has a plasma discharge width that is less than the width of the card. The card and the plasma nozzle are moved relative to one another using a two direction control scheme during plasma treatment in order to be able to plasma treat a desired area of the card surface. The card and the plasma nozzle may also be moveable toward or away from one another to change the distance therebetween.

15 Claims, 6 Drawing Sheets

(52) U.S. Cl.
CPC ..... *B41M 5/0064* (2013.01); *H01J 37/32376* (2013.01); *H01J 37/32752* (2013.01); *H01J 37/32889* (2013.01)

(58) Field of Classification Search
CPC .. B41J 13/12; B41J 11/0015; H01J 37/32889; H01J 37/32752; H01J 37/32376
See application file for complete search history.

(56) References Cited

U.S. PATENT DOCUMENTS

| | | | |
|---|---|---|---|
| 6,783,067 B2 | 8/2004 | Kreuter | |
| 6,902,107 B2 | 6/2005 | Shay | |
| 6,981,767 B2 | 1/2006 | Schmitt | |
| 7,281,792 B2 | 10/2007 | Schmitt | |
| 7,341,340 B2 | 3/2008 | Schmitt | |
| 7,398,972 B2 | 7/2008 | Schuller | |
| 7,434,728 B2 | 10/2008 | Paulson | |
| 7,770,519 B2 | 8/2010 | Schmitt | |
| 7,819,058 B2 | 10/2010 | Schmitt | |
| 2005/0099486 A1* | 5/2005 | Schmitt | B41J 11/0015 347/106 |
| 2007/0218308 A1 | 9/2007 | Lewtas | |
| 2011/0084148 A1 | 4/2011 | Ricketts | |

OTHER PUBLICATIONS

Plasmatreat "RD2005 rotary nozzle: Rotating unit with two plasma nozzles"; obtained from https://www.plasmatreat.com/plasma-system-components/plasma-nozzles/rotary-nozzle-RD2005.html on Jul. 20, 2018; 2 pages.

Atlantic Zeiser; "Persomaster: EMV Banking Card Personalization System First with DoD Inkjet Technology"; obtained by Applicant on or around Feb. 7, 2017; 6 pages.

* cited by examiner

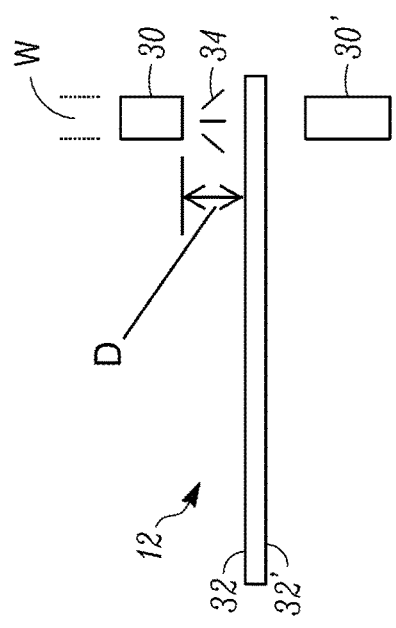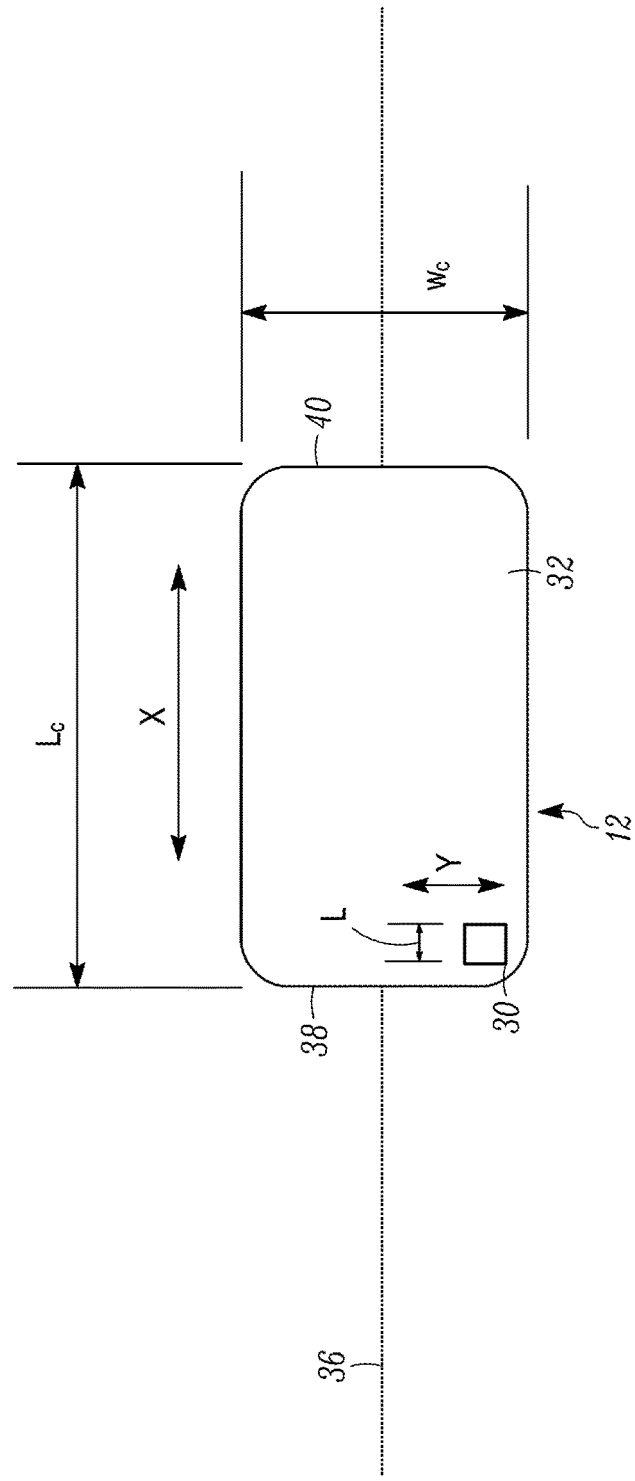

DROP-ON-DEMAND IDENTIFICATION DOCUMENT PRINTING WITH SURFACE PRE-TREATMENT

FIELD

This description relates to performing printing operations on surfaces of plastic or composite cards such as financial (e.g., credit, debit, or the like) cards, driver's licenses, national identification cards, business identification cards, gift cards, and other plastic or composite cards which bear or will bear personalized data unique to the cardholder and/or which bear other card information. The printing techniques described herein can be also be used to print on passport pages which bear or will bear personalized data unique to the intended passport holder and/or which bear other passport information.

BACKGROUND

It is known to process identification documents such as plastic cards using various techniques including printing, embossing, reading data from and/or writing data to a magnetic stripe, reading data from and/or programming an integrated circuit chip, applying holographic foil patches, and the like. In one known process, drop-on-demand printing is performed on a card surface after the card surface has been plasma treated.

SUMMARY

Apparatus, systems and methods are described where an identification document such as a plastic card or a passport page is printed on in a printer after a surface of the identification document has been plasma treated using a plasma treatment method. The plasma treatment of the surface makes the surface more receptive to the printing. The printing can be any type of printing that may benefit from a plasma pre-treatment of the surface. Examples of printing include, but are not limited to, drop-on-demand printing in a drop-on-demand printer that prints using ink, including but not limited to ultra-violet (UV) radiation curable ink.

The identification document can be any type of identification document that bears or will bear personalized data unique to the intended document holder and/or which bears other document information. Examples of identification documents include, but are not limited to, plastic or composite cards such as financial (e.g., credit, debit, or the like) cards, driver's licenses, national identification cards, business identification cards, gift cards, and other plastic or composite cards which bear or will bear personalized data unique to the cardholder and/or which bear other card information; and passports and passport pages which bear or will bear personalized data unique to the intended passport holder and/or which bear other passport information.

In one embodiment, a single plasma nozzle of a plasma treatment station is used to treat the document surface. The use of a single plasma nozzle is less costly than using multiple nozzles or using a rotary plasma unit each of which may be able to plasma treat the entire document surface in a single pass of the document.

The single plasma nozzle has a plasma discharge width that is less than the width of the document. In order to plasma treat the surface, the flow of the plasma that impacts the surface is controlled in two directions (i.e. in an x and y plane) in order to facilitate desired treatment of the surface using the single plasma nozzle. The two direction control can be achieved in at least three ways: (1) moving the plasma nozzle in two directions while keeping the identification document stationary; (2) moving the identification document in two directions while keeping the plasma nozzle stationary; or (3) moving the plasma nozzle in one direction and moving the identification document in a second direction.

In another embodiment, the plasma nozzle and the identification document can be moved relative to one another to alter the distance between the plasma nozzle and the surface of the identification document. For example, the plasma nozzle can be mounted so as to be moveable closer to or away from the identification document, or the identification document can be mounted so as to be moveable closer to or away from the plasma nozzle, or both the plasma nozzle and the identification document can be mounted so as to be moveable closer to or away from one another.

In one embodiment, a second single plasma nozzle can be provided. The second single plasma nozzle can be positioned and oriented to provide pre-treatment to a second, opposite surface of the identification document.

The techniques described herein can be applied to a plastic card identification documents such as a financial (e.g., credit, debit, or the like) card, driver's license, national identification card, business identification card, gift card, and other plastic cards which bear personalized data unique to or assigned specifically to the cardholder and/or which bear other card information. The term "plastic card" as used herein is intended to encompass cards that are completely or substantially plastic, as well as cards that have non-plastic or composite components (i.e. a composite card) and cards having other formulations that function like the card types indicated above. Cards that are encompassed by the term "plastic cards" often bear printed personalized data unique to or assigned specifically to the cardholder, such as the name of the cardholder, an account number, an image of the face of the cardholder, and other data. The techniques described herein can also be applied to passports and passport pages that are plastic or that have plastic layers or coatings whose surfaces may need to be plasma treated to make the surface more receptive to ink as with plastic cards.

In one embodiment, a method of pre-treating a surface of an identification document prior to performing drop-on-demand printing on the surface includes plasma treating the surface of the document using a single plasma nozzle in a plasma treatment station.

In another embodiment, a method of processing an identification document in an identification document printing system includes, in the identification document printing system, plasma treating a surface of the identification document using a single plasma nozzle in a plasma treatment station. Thereafter, the identification document is input into a drop-on-demand printer of the identification document printing system, and thereafter the surface of the identification document is printed on using the drop-on-demand printer. In one embodiment, the ink used by the drop-on-demand printer may be UV-radiation curable ink.

In another embodiment, a method of processing an identification document in an identification document printing system includes, in the identification document printing system, plasma treating a surface of the identification document using a plasma nozzle in a plasma treatment station by moving the plasma nozzle and the identification document relative to one another so the surface is treated in a non-linear pattern where the plasma nozzle follows a non-linear path over the document surface, and thereafter printing on the surface of the identification document using the drop-on-demand printer.

In still another embodiment, a method of personalizing a plastic card includes plasma treating at least a portion of the surface of the plastic card using a moveable plasma nozzle, and printing personalized data on at least a portion of the plasma treated surface using a drop-on-demand printer.

In still another embodiment, a method of pre-treating a surface of an identification document prior to performing drop-on-demand printing on the surface includes using a plasma nozzle to plasma treat at least a portion of the surface of the identification document while moving the relative positions of the surface and the plasma nozzle along a first and a second axis.

An embodiment of an identification document printing system described herein can include an identification document input that can hold a plurality of identification documents prior to printing, an identification document output that can hold a plurality of identification documents that have been printed on, and a plasma treatment station located between the identification document input and the identification document output that has an identification document travel path along which an identification document travels through the plasma treatment station. The plasma treatment station includes a plasma nozzle that is oriented toward the identification document travel path to discharge plasma onto a surface of an identification document, with the plasma nozzle having a plasma discharge width that is less than the width of the identification document. In addition, the plasma nozzle is movable relative to the identification document travel path. In addition, a drop-on-demand printer is located between the identification document input and the identification document output, and a card transport system is provided that transports identification documents between the identification document input, the plasma treatment station, the drop-on-demand printer, and the identification document output.

DRAWINGS

FIG. 2 is a side view showing the plasma nozzle described herein discharging onto a surface of the identification document.

FIG. 3 is a top plan view showing the plasma nozzle relative to the identification document.

DETAILED DESCRIPTION

Figure 1:
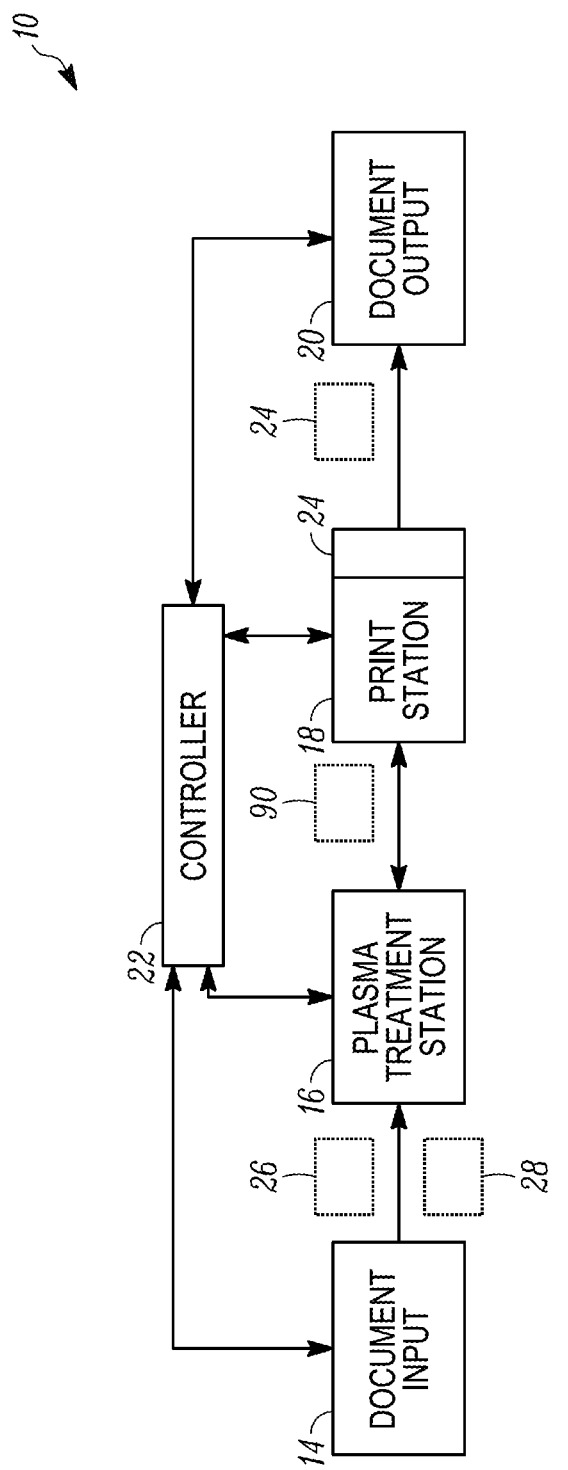
FIG. 1 is a schematic illustration of one embodiment of an identification document printing system described herein.

As described in further detail below, some or all of a surface of an identification document is plasma treated prior to performing printing on the plasma treated surface in a printer to make the surface more receptive to the colorant used in the printing. The printing can be any type of printing that may benefit from a plasma pre-treatment of the surface. Examples of printing include, but are not limited to, drop-on-demand printing in a drop-on-demand printer that prints using ink, including but not limited to ultra-violet (UV) radiation curable ink. For sake of convenience, the following description will describe the printing as being drop-on-demand printing in a drop-on-demand printer. However, other types of printing can be utilized.

The identification document can be any type of identification document that bears or will bear personalized data unique to the intended document holder and/or which bears other document information. Examples of identification documents include, but are not limited to, plastic or composite cards such as financial (e.g., credit, debit, or the like) cards, driver's licenses, national identification cards, business identification cards, gift cards, and other plastic or composite cards which bear or will bear personalized data unique to the cardholder and/or which bear other card information; and passports and passport pages which bear or will bear personalized data unique to the intended passport holder and/or which bear other passport information.

For sake of convenience in describing the techniques herein, the identification document will hereinafter be referred to as a "plastic card", "identification card" or "card". However, the techniques described herein can be applied to other identification documents having one or more surfaces that can be plasma treated to make the surface(s) more receptive to ink as with plastic cards.

The term "plastic card" as used herein is intended to encompass cards that are completely or substantially plastic, as well as cards that have non-plastic or composite components (composite cards) and cards having other formulations that function like the card types indicated above. Cards that are encompassed by the term "plastic cards" often bear printed personalized data unique to or assigned specifically to the cardholder, such as the name of the cardholder, an account number, an image of the face of the cardholder, and other data.

The techniques described herein can be applied to all types of plastic cards such as financial (e.g., credit, debit, or the like) cards, driver's licenses, national identification cards, business identification cards, gift cards, and other plastic cards which bear personalized data unique to or assigned specifically to the cardholder and/or which bear other card information. In one non-limiting example, the techniques described herein can be used on plastic financial cards. A financial card, which may also be referred to as a credit card or a debit card, as used herein refers to a type of card that allows the cardholder to borrow funds or that has a stored monetary value. A financial card typically has at least a cardholder name and an account number provided thereon, often by printing. A financial card may also have an integrated circuit chip that stores data relating to the card and/or a magnetic stripe that stores data relating to the card and/or a signature panel that allows a user to sign their name and/or a holographic foil patch.

The techniques described herein can be implemented in any suitable plastic card printing system. In one embodiment, the plastic card printing system as a whole, and the plasma treatment and printing techniques described herein, have a card throughput of at least about 1500 cards per hour. In other embodiments, the plastic card printing system and the plasma treatment and printing techniques described herein can have a card throughput of at least 2500 cards per hour, and in further embodiments can have a throughput of at least 3000 cards per hour.

One example of a type of plastic card printing system that can be used is referred to as a central issuance card processing system that is typically designed for large volume batch processing of plastic cards, often employing multiple processing stations or modules to process multiple plastic cards at the same time to reduce the overall per card processing time. Examples of central issuance card processing systems include the MX family of central issuance systems available from Entrust Datacard Corporation of Shakopee, Minn. Other examples of central issuance systems are disclosed in U.S. Pat. Nos. 4,825,054, 5,266,781, 6,783,067, and 6,902,107, all of which are incorporated herein by reference in their entirety.

Another example of a type of plastic card printing system that can be used is referred to as a desktop card processing system that is typically designed for relatively small scale, individual plastic card processing. In desktop processing systems, a single plastic card to be processed is input into the system, processed, and then output. These systems are often termed desktop machines or desktop printers because they have a relatively small footprint intended to permit the machine to reside on a desktop. Many examples of desktop machines are known, such as the SD or CD family of desktop card machines available from Entrust Datacard Corporation of Shakopee, Minn. Other examples of desktop card machines are disclosed in U.S. Pat. Nos. 7,434,728 and 7,398,972, each of which is incorporated herein by reference in its entirety.

FIG. 1 illustrates an example of one embodiment of an identification document printing system 10 that can be used to plasma treat and print on identification documents such as plastic cards 12 (see FIGS. 2 and 3) as described herein. In this example, the system 10 can include an identification document input 14, a plasma treatment station 16, a print station 18 such as a drop-on-demand print station, and an identification document output 20. As discussed above, the elements 14-20 in the system 10 can be part of a central issuance identification document processing system or part of a desktop identification document processing system. The elements 14-20 can be separate stations or modules, or the functionalities of one or more of the elements 14-20 can be combined into what may be considered a common station or module with the other elements. For example, the plasma treatment station 16 and the print station 18 of FIG. 1 could be combined into what may be considered a common station instead of being separate stations as implied in FIG. 1. A controller 22 is connected to and controls the operation of each of the elements 14-20.

The identification document input 14 can be an identification document input hopper designed to hold a plurality of identification documents waiting to be fed on-by-one into the system 10 for processing. An example of an identification document input hopper in the form of a card input hopper is described in U.S. Pat. No. 6,902,107 which is incorporated herein by reference in its entirety. Alternatively, the identification document input 14 can be an input slot through which individual documents are fed one-by-one into the system 10.

The plasma treatment station 16 is configured to pre-treat a desired portion of the surface of the identification document 12 using a stream of ionized gas to render the plasma-treated surface more receptive to the subsequent application of ink that is applied to the plasma-treated surface in the print station 18 so that the printed ink adheres better to the surface. In one embodiment, the plasma treatment station 16 can include a blown ion plasma system. The general concept of plasma treating a surface of an identification document such as a card is well known in the art. In one embodiment, the plasma treatment performed by the plasma treatment station 16 occurs at a rate of at least about 1500 documents per hour.

Referring to FIGS. 2 and 3, one non-limiting embodiment of the plasma treatment station 16 will be described. In the illustrated embodiment, the plasma treatment station 16 includes a single plasma nozzle 30 that treats the document surface. The single plasma nozzle 30 has a maximum plasma discharge width W that is less than the width $W_c$ of the document 12, as well as a length L that is less than the length $L_c$ of the document 12. FIGS. 2-3 show the plasma nozzle 30 being directed at or facing a surface 32 of the document 12 so that a plasma stream 34 discharged from the nozzle 30 will impact the surface 32. Because the width W is less than the width $W_c$ of the document 12, and the length L is less than the length $L_c$ of the document 12, the plasma stream 34 only contacts a portion of the document surface 32 at any moment in time. Accordingly, if treatment of the entire document surface 32 or other portions of the document surface 32 is desired, the flow of the plasma that impacts the surface is controlled in two directions (i.e. in an x and y plane) in order to facilitate desired treatment of the surface using the single plasma nozzle.

The two direction control can be achieved in at least three ways: (1) moving the plasma nozzle 30 in two directions while keeping the document 12 stationary; (2) moving the document 12 in two directions while keeping the plasma nozzle 30 stationary; or (3) moving the plasma nozzle 30 in one direction and moving the document 12 in a second direction. Any of these two direction control schemes can be utilized. For sake of convenience, the two direction control scheme will be described in the following description as moving the plasma nozzle 30 in one direction and moving the document 12 in a second direction.

A document transport system is provided that transports the document 12 along a document travel path 36 between the document input 14, the plasma treatment station 16, the print station 18 and the document output 20. The document transport system can have any construction suitable for transporting the document 12. Many examples of document transport systems that could be used are well known in the art. Examples of card transport systems that can be used include, but are not limited to, rollers, belts (with tabs or without tabs), carriage(s), any combinations thereof, and the like. The construction and operation of document transport systems for transporting documents between a document input, a document output, and document processing stations between a document input and a document output are well known in the art. A portion of the document travel path 36 through the plasma treatment station 16 is indicated in dashed lines in FIG. 3. The document travel path 36, at least from the card input 14, through the plasma treatment station 16, through the print station 18 and into the document output 20, is linear or straight.

The movement of the document 12 along the document travel path 36 relative to the plasma nozzle 30 is suitable to permit treatment of a limited surface area of the surface 32 from a first end 38 of the document 12 to a second end 40 over a width of the surface 32 corresponding to the discharge width W. If treatment of additional surface area of the surface 32 is desired, the plasma nozzle 30 and/or the document 12 must also be moved in a direction Y that is transverse or perpendicular to a direction X of the movement of the document 12 along the document travel path.

In the illustrated example, the plasma nozzle 30 is mounted so as to be able to move in the direction Y (or first direction) relative to the document 12, with the plasma nozzle 30 driven by a suitable plasma nozzle drive mechanism. At the same time, the document 12 is movable in the direction X (or second direction) by the document transport system relative to the plasma nozzle 30. In one embodiment, the document 12 is movable relative to the plasma nozzle 30 both in forward and reverse directions along the X direction as indicated by the double headed arrow in FIG. 3. Likewise, the plasma nozzle 30 is movable relative to the document 12 in both forward and reverse directions along the Y direction as indicated by the double headed arrow in FIG. 3. This ensures that, if desired, the entire surface 32 of the document 12 can be plasma treated by the plasma nozzle 30 through suitable relative movements of the document 12 and the plasma nozzle 30. Therefore, if the entire surface is to be treated, the document 12 is moved back and forth in the X direction (or the second direction) during plasma treatment while in the plasma treatment station.

The movements of the document 12 and/or the movements of the plasma nozzle 30 are controlled by the controller 22 so as to move relative to one another to plasma treat the desired area(s) of the surface 32 of the document 12. In an embodiment where all or substantially all of the surface 32 is to be plasma treated, the document 12 and the plasma nozzle 30 can be moved relative to one another so that the surface 32 is treated in what may be referred to as a non-linear treatment pattern, non-limiting examples of which are described below with respect to FIGS. 4 and 5. In one non-limiting embodiment, the plasma nozzle 30 can make 5 passes over different portions of the document surface 32 generally from the first end 38 to the second end 40 when treating the entire surface 32. However, a different number of passes of the plasma nozzle 30 over the document surface 32 can be used to treat the entire surface.

Figure 4:
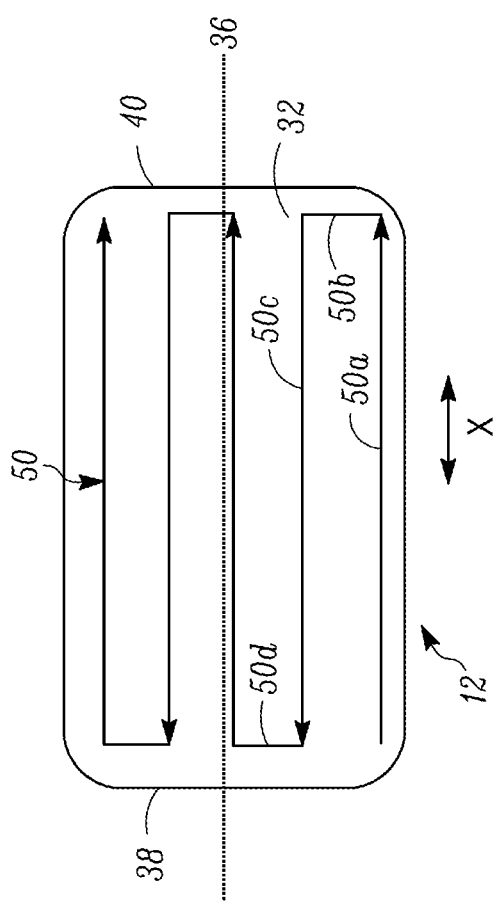
FIG. 4 depicts one example of a serpentine movement pattern between the plasma nozzle and the identification document as they move relative to one another.

For example, referring to FIG. 4, one embodiment of a non-linear treatment pattern 50 in the form of a serpentine treatment pattern is illustrated for plasma treating all or substantially all of the surface 32. In this embodiment, in one leg 50a of the pattern 50, the document 12 can be moved along the document travel path 36 relative to the plasma nozzle 30 in the direction X from one end 38 of the document 12 to the second end 40. The pattern 50 then includes a leg 50b where the plasma nozzle 30 is moved relative to the document 12 in the direction Y, followed by a leg 50c where the document 12 is moved in reverse relative to the plasma nozzle 30 in the direction X, followed by a leg 50d where the plasma nozzle 30 is moved relative to the document 12 in the direction Y. These alternating relative movements between the document 12 and the plasma nozzle 30, and between the plasma nozzle 30 and the document 12, continue until the desired area(s) of the surface 32 is plasma treated.

Figure 5:
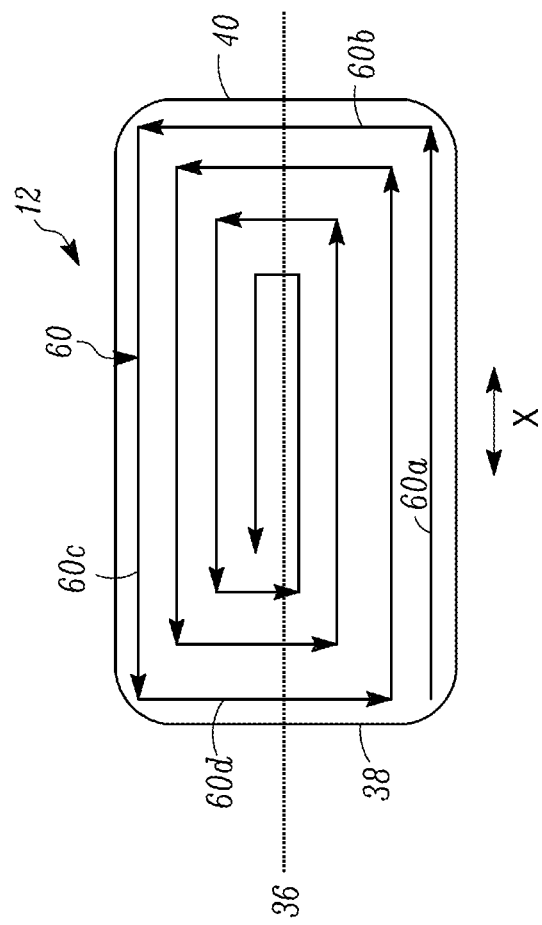
FIG. 5 depicts another example of a serpentine movement pattern between the plasma nozzle and the identification document as they move relative to one another.

FIG. 5 illustrates another embodiment of a non-linear treatment pattern 60 in the form of a serpentine treatment pattern for plasma treating all or substantially all of the surface 32. In this embodiment, in one leg 60a of the pattern 60, the document 12 can be moved along the document travel path 36 relative to the plasma nozzle 30 in the direction X from one end 38 of the document 12 to the second end 40. The pattern 60 then includes a leg 60b where the plasma nozzle 30 is moved relative to the document 12 in the direction Y, followed by a leg 60c where the document 12 is moved in reverse relative to the plasma nozzle 30 in the direction X, followed by a leg 60d where the plasma nozzle 30 is moved relative to the document 12 in the direction Y. These alternating relative movements between the document 12 and the plasma nozzle 30, and between the plasma nozzle 30 and the document 12, continue in a decreasing or inward "spiral" pattern until the desired area of the surface 32 is plasma treated. In an alternative embodiment, the pattern 60 may increase in size in an increasing or outward "spiral" pattern opposite of the spiral pattern illustrated in FIG. 5.

In another embodiment (not shown), a non-linear treatment pattern, for example a serpentine treatment pattern, can be used to treat a portion of the surface 32 that is less than the entire surface. For example, a portion of the surface 32 intended to contain printing such as a person's name or account number can be plasma treated with the remaining area of the surface 32 not being plasma treated. In addition, some or all of the treatment pattern used to treat the surface 32 can be curved, rather than the straight lines illustrated in FIGS. 4 and 5, resulting from simultaneous movements of the document 12 and the plasma nozzle 30 in the X and Y directions.

Referring back to FIG. 2, in another embodiment, the plasma nozzle 30 and the identification document 12 can be moved relative to one another to alter the distance D between the plasma nozzle 30 and the surface 32 of the identification document 12. Altering the distance D for treating the surface can occur separately from the X and Y movements described above (i.e. there are no X and Y movements for treating the surface prior to, during or after altering the treatment distance D), or can be used together with the X and Y movements described above (i.e. the surface can be plasma treated both with the X and Y movements as well as by altering the distance D prior to, during or after the X and Y movements). Altering the distance D has a number of benefits such as accommodating different surface properties of the identification document 12 or between identification documents 12, achieving different print effects on the identification document 12 or on a subsequent identification document 12, and accommodating wear that occurs on the plasma nozzle 30 over time.

The distance D can be altered in any suitable manner. For example, the plasma nozzle 30 can be mounted so as to be moveable closer to or away from the identification document 12, or the identification document 12 can be mounted so as to be moveable closer to or away from the plasma nozzle 30, or both the plasma nozzle 30 and the identification document 12 can be mounted so as to be moveable closer to or away from one another.

For example, when treating the surface 32 of the identification document 12, one portion of the surface 32 can be treated with the plasma nozzle 30 and the surface 32 spaced at a first distance D1 while a second portion of the surface 32 can be treated with the plasma nozzle 30 and the surface 32 spaced at a second distance D2, where the second distance D2 is different than (e.g. larger than or smaller than) the first distance D1. Similarly, the surface 32 of one identification document 12 can be treated with the plasma nozzle 30 and the surface 32 spaced at a first distance D1 while the surface 32 of a second identification document 12 can be treated with the plasma nozzle 30 and the surface 32 spaced at a second distance D2, where the second distance D2 is different than (e.g. larger than or smaller than) the first distance D1. The first identification document 12 and the second identification document 12 may be in sequential order with the second identification document immediately following the first identification document.

In another embodiment, the surface 32 of the identification document 12, or the surfaces of two sequential identification documents 12, may be treated using different intensities from the plasma stream 34. The different intensities can be generated in any manner. For example, the different intensities could result from altering the distance D between the plasma nozzle 30 and the surface of the identification document(s), or by altering the intensity of the plasma stream 34 that is output from the plasma nozzle 30.

Figure 6:
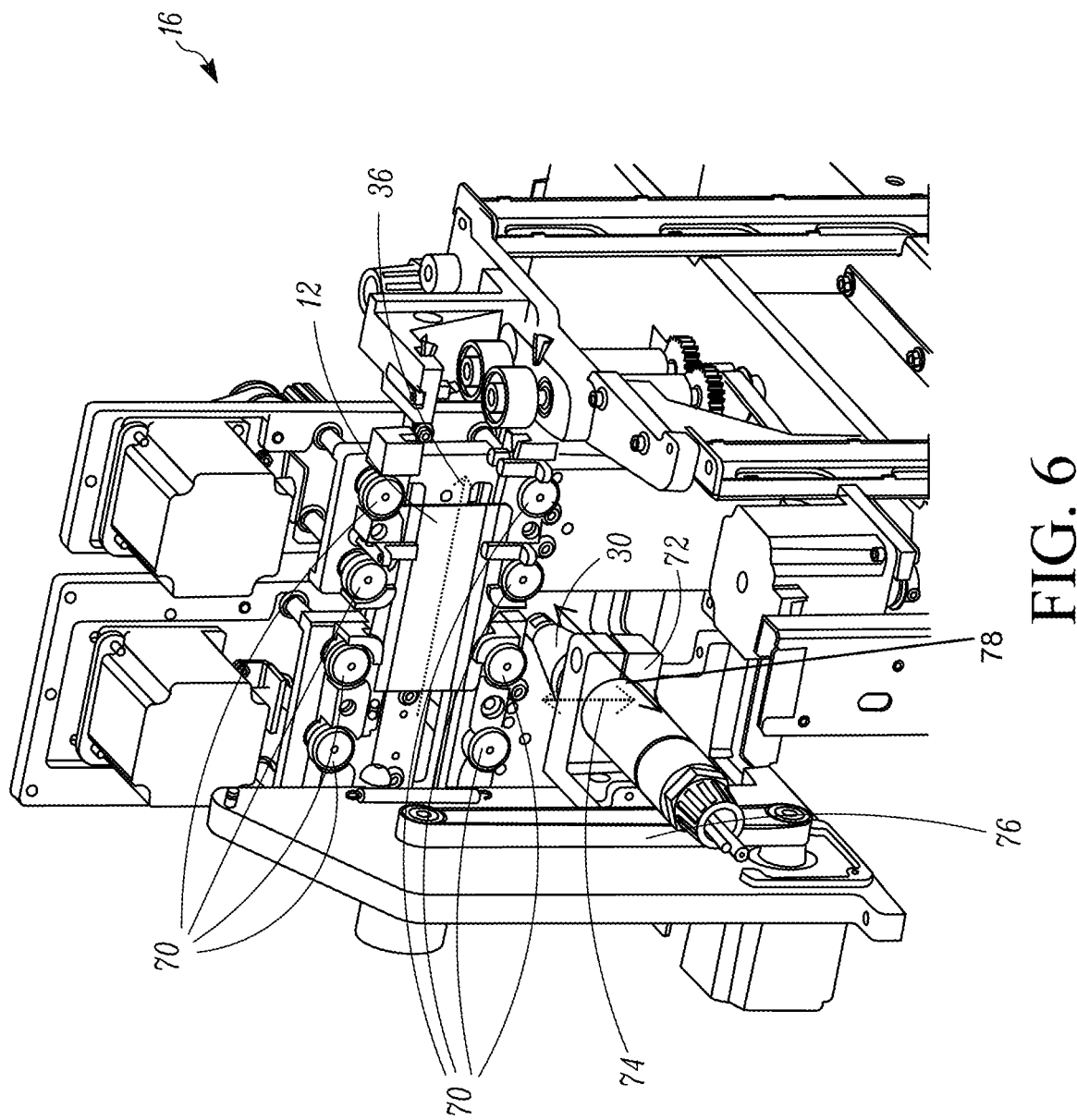
FIG. 6 illustrates an example implementation of a plasma treatment station described herein.

FIG. 6 illustrates an example implementation of the plasma treatment station 16. In this example, during plasma treatment of the surface, the document 12 can be moved along the document travel path 36 by a plurality of drive rollers 70 that are part of the document transport system. In addition, the plasma nozzle 30 is fixed in a mounting block 72 that can be moved up and down, separately from the movement of the document 12 or simultaneously with the movement of the document 12, in the direction of the arrows 74 perpendicular to the travel path 36 via a drive belt mechanism 76 that is connected to the mounting block 72 so as to actuate the mounting block 72. In addition, as described further above, the nozzle 30 may also be movable toward or away from the document 12 in the direction of the arrows 78, to adjust the distance D (FIG. 2) of the nozzle 30 from the document surface.

Returning to FIG. 1, in the embodiment where the print station 18 performs drop-on-demand printing, the print station 18 includes a drop-on-demand printer that performs drop-on-demand printing using a suitable ink. In one non-limiting embodiment, the ink used by the drop-on-demand printer is UV-radiation curable ink that is cured by exposing the applied ink to UV radiation. An optional UV radiation applicator 24 can be included in the station 18 or separate from the station 18 (indicated in dashed lines in FIG. 1) to apply the UV radiation to cure the UV-radiation curable ink after the UV-radiation curable ink is applied. The drop-on-demand printer used in the station 18 and the UV radiation applicator 24 (if used) can be conventional mechanisms well known in the art. An example of a drop-on-demand printer and a UV radiation applicator in a card printing system is the Persomaster card personalization system available from Atlantic Zeiser GmbH of Emmingen, Germany.

The document output 20 can be a document output hopper designed to hold a plurality of processed documents that are output one-by-one after being processed within the system 10. An example of a document output hopper in the form of a card output hopper is described in U.S. Pat. No. 6,902,107 which is incorporated herein by reference in its entirety. Alternatively, the document output 20 can be an output slot through which individual documents are output one-by-one. In the case of central issuance document processing systems, the document output 20 can be the last element in the system 10 and located at the downstream end of the system 10. However, the document output 20 is not required in a central issuance document processing system and the processed cards can be output directly to an inserter mechanism that attaches the cards to card carrier forms to create card/carrier combinations, folds the card/carrier combinations and inserts the card carrier combinations into envelopes for mailing to the intended recipients. In the case of desktop document processing systems, the document output 20 can be located at the downstream end of the system 10 in some systems, or even located at the same end of the system 10 as the document input 14.

In operation, a document 12 to be processed is input from the document input 14 and transported into the plasma treatment station 16. The desired area(s) of the surface 32 of the document 12 is then plasma treated by the plasma nozzle 30. Once the plasma treatment is finished, the document 12 is input into the print station 18 by the document transport mechanism and the printer, for example drop-on-demand printer, prints on the surface 32. In the case where UV-radiation curable ink is used, once printing is finished, UV radiation is applied to the surface 32 to cure the UV-radiation curable ink. If no further processing of the document 12 is to be performed, the document 12 can then be output to the document output 20.

Returning to FIG. 1, the system 10 can include additional stations in addition to the stations 14, 16, 18, 20, with the additional stations controlled by the controller 22. For example, the system 10 can include an optional document flipper 90 (illustrated in dashed lines in FIG. 1). A document flipper (or document reorienting mechanism) can rotate the document 180 degrees so that a surface initially facing upward (or facing to one side) now faces downward (or faces toward the opposite side). The document flipper 90 is useful in embodiments where plasma treatment and printing are desired on each of the top and bottom (or front and back) surfaces of the document 12 in which case the plasma treatment and the printing on each of the document surfaces can be performed using the single plasma treatment station 16 and the single print station 18. In some embodiments, the document flipper 90 can be positioned between the plasma treatment station 16 and the print station 18. However, the document flipper 90 can be located elsewhere in the system 10. In this embodiment, some or all of the document transport system can be bi-directional to provide for reverse transport of the document. For example, if the card flipper is used and the card flipper is located between the plasma treatment station 16 and the print station 18, the document transport system between the plasma treatment station 16 and the card flipper 90, and between the card flipper 90 and the print station 18 can be bi-directional so that the document 12 can be transported back and forth between the stations.

In addition, the system 10 can include one or more of a magnetic stripe station that reads data from and/or writes data to a magnetic stripe on the document 12, an integrated circuit chip station that can read data from and/or program data to a programmable integrated circuit chip on the document 12 or simultaneously read data from and/or program data to multiple documents, a thermal transfer print station that performs thermal dye or ink printing, an embossing station that embossed characters on the document, an indenting station that indents characters on the document, a document verification station that verifies data applied to the document, and other document processing stations that are well known in the art of identification document processing. The additional stations can be located anywhere in the system 10 with some of the stations, such as a magnetic stripe station and an integrated circuit chip station, being located between the document input 14 and the plasma treatment station 16, and some of the stations being located between the drop-on-demand print station 18 and the document output 20. FIG. 1 illustrates an example location of a magnetic stripe station 26 and an integrated circuit chip station 28 between the document input 14 and the plasma treatment station 16. However, the stations 26, 28 can be at other locations in the system 10.

In an embodiment, a second single plasma nozzle 30' (illustrated in FIG. 2) can be provided in addition to the plasma nozzle 30. The second single plasma nozzle 30' is positioned and oriented to provide pre-treatment to a second, opposite surface 32' of the document 12 in a manner similar to the plasma nozzle 30. The second plasma nozzle 30' can have a construction similar to the plasma nozzle 30. As discussed above for the plasma nozzle 30, the plasma nozzle 30' can plasma treat the desired area(s) of the surface 32' using a two direction control scheme such as: (1) moving the plasma nozzle 30' in two directions while keeping the document 12 stationary; (2) moving the document 12 in two directions while keeping the plasma nozzle 30' stationary; or (3) moving the plasma nozzle 30' in one direction and moving the document 12 in a second direction.

Figure 7:
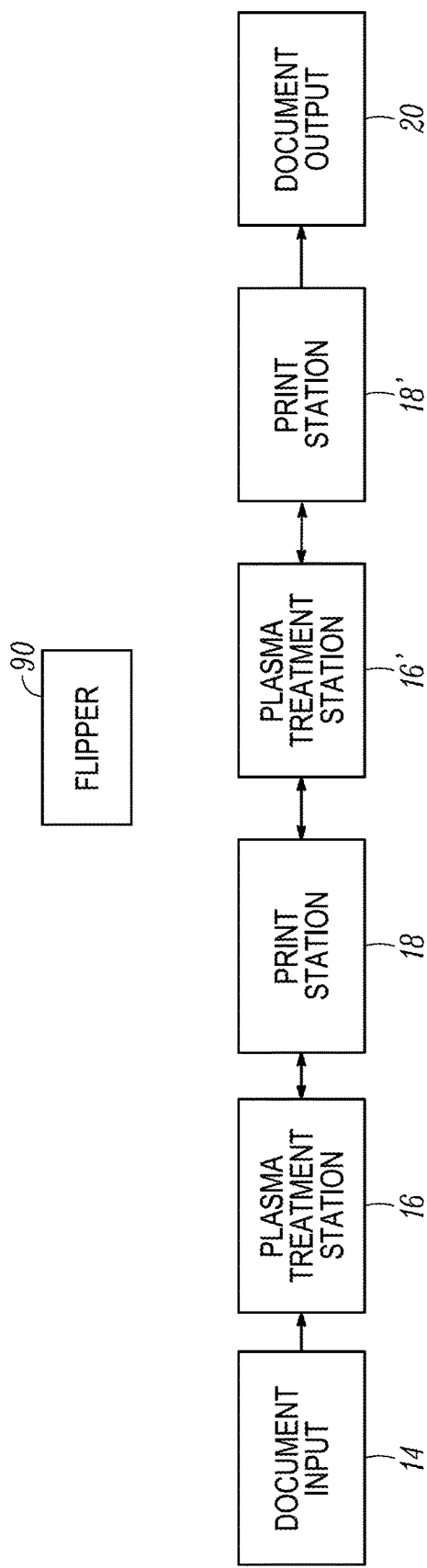
FIG. 7 is a schematic illustration of another embodiment of an identification document printing system described herein.

The second plasma nozzle 30' can be located in the plasma treatment station 16 of FIG. 1. Alternatively, as illustrated in FIG. 7, the second plasma nozzle 30' can be located in a second plasma treatment station 16'. FIG. 7 illustrates a system that includes the first plasma treatment station 16, the print station 18, the second plasma treatment station 16', and a second print station 18', such as a drop-on-demand print station, that prints in a manner similar to the print station 18. In this embodiment, a document flipper 90 can be provided in the system 10' to rotate the document 180 degrees prior to reaching the second print station 18' so that the surface 32' faces in the correct direction (for example, upward) for printing on the surface 32' by the print station 18. In one embodiment, when the plasma nozzles of the plasma treatment stations 16, 16' are disposed on the same side of the card travel path, the flipper 90 can be between the print station 18 and the plasma treatment station 16' to flip the document 180 degrees after printing in the print station 18. In another embodiment (not illustrated), when the plasma nozzles of the plasma treatment stations 16, 16' are disposed on opposite sides of the card travel path, the flipper 90 can be between the plasma treatment station 16' and the print station 18' to flip the document 180 degrees after the plasma treatment in the plasma treatment station 16'. The positional arrangement of the plasma treatment stations 16, 16', the print stations 18, 18' and the document flipper 90 shown in FIG. 7 is an example only. Many other positional arrangements of the plasma treatment stations 16, 16', the print stations 18, 18' and the document flipper 90 are possible. In addition, in some embodiments, transport of the document between the plasma treatment station 16 and the print station 18, between the print station 18 and the plasma treatment station 16', and between the plasma treatment station 16' and the print station 18' can be one-way, i.e. the document will be transported in one direction only and is not backed-up or reversed. However, in other embodiments, the document transport can be bi-directional.

Figure 8:
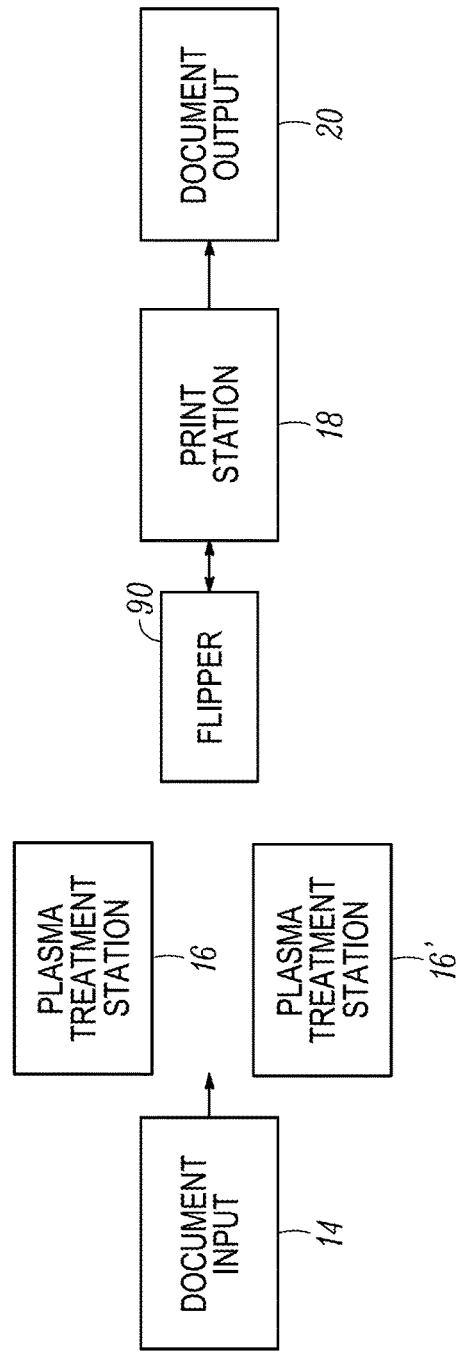
FIG. 8 is a schematic illustration of another embodiment of an identification document printing system described herein.

FIG. 8 illustrates another embodiment of a system that uses the two separate plasma treatment stations 16, 16' disposed on opposite sides of the document travel path, the print station 18, and the document flipper 90. The plasma treatment stations 16, 16' can be positioned generally opposite each other as illustrated in FIG. 8, or spaced from one another along the card travel path. The positional arrangement of the plasma treatment stations 16, 16', the print station 18, and the document flipper 90 shown in FIG. 8 is an example only. Many other positional arrangements of the plasma treatment stations 16, 16', the print station 18, and the document flipper 90 are possible. In FIG. 8, some portions of the document transport can be one-way and some portions of the document transport can be bi-directional.

Figure 9:
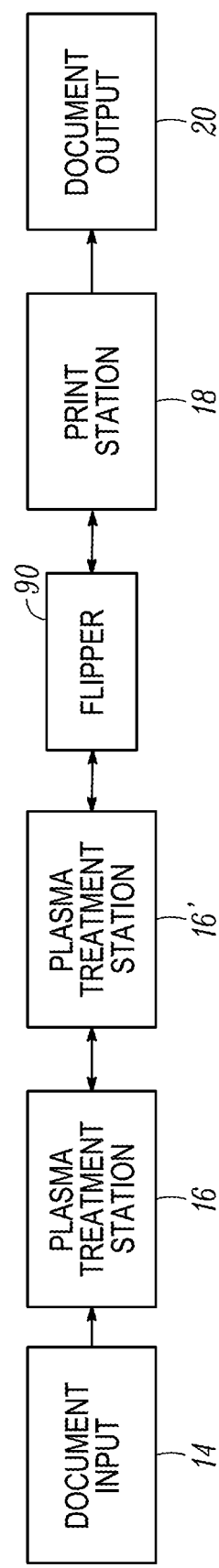
FIG. 9 is a schematic illustration of another embodiment of an identification document printing system described herein.

FIG. 9 illustrates another embodiment of a system that uses the two separate plasma treatment stations 16, 16' disposed on the same side of the document travel path, the print station 18, and the document flipper 90. The positional arrangement of the plasma treatment stations 16, 16', the print station 18, and the document flipper 90 shown in FIG. 9 is an example only. Many other positional arrangements of the plasma treatment stations 16, 16', the print station 18, and the document flipper 90 are possible. In FIG. 9, some portions of the document transport can be one-way and some portions of the document transport can be bi-directional.

Additional possible variants of the methods and systems described herein include the following variants listed below. In each of the following variants, the entire surface of the document can be plasma treated, or only a portion of the document surface can be treated. If the entire surface is to be treated, the document can be moved back and forth in the X direction (or the second direction) during plasma treatment while in the plasma treatment station, while the plasma nozzle is moved back and forth in the Y-direction (or the first direction) perpendicular to the X-direction.

Variant 1: A method of pre-treating a surface of an identification document prior to performing printing on the surface, comprising plasma treating the surface of the identification document using a single plasma nozzle in a plasma treatment station.

Variant 2: The method of variant 1, further comprising during the step of plasma treating, moving the single plasma nozzle in a first direction and moving the identification document in a second direction.

Variant 3: The method of any one of variants 1 to 2, wherein the second direction is substantially perpendicular to the first direction.

Variant 4: The method of any one of variants 1 to 3, further comprising moving the single plasma nozzle and the identification document relative to one another so that the surface is plasma treated in a non-linear pattern.

Variant 5: The method of any one of variants 1 to 4, wherein the step of plasma treating comprises moving the single plasma nozzle and the identification document relative to one another to plasma treat the surface at a rate of at least about 1500 documents per hour.

Variant 6: The method of any one of variants 1 to 5, wherein the identification document comprises a plastic card that includes an integrated circuit chip; and further comprising reading data from and/or writing data to the integrated circuit chip.

Variant 7: The method of any one of variants 1 to 6, wherein the identification document comprises a plastic card that includes a magnetic stripe; and further comprising reading data from and/or writing data to the magnetic stripe.

Variant 8: A method of processing an identification document in an identification document printing system, comprising: in the identification document printing system, plasma treating a surface of the identification document using a single plasma nozzle in a plasma treatment station; thereafter, inputting the identification document into a printer of the identification document printing system; and thereafter printing on the surface of the identification document using the printer.

Variant 9: The method of variant 8, further comprising during the step of plasma treating, moving the single plasma nozzle in a first direction and moving the identification document in a second direction.

Variant 10: The method of any one of variants 8 to 9, wherein the second direction is substantially perpendicular to the first direction.

Variant 11: The method of any one of variants 8 to 10, further comprising moving the single plasma nozzle and the identification document relative to one another so that the surface is plasma treated in a non-linear pattern.

Variant 12: The method of any one of variants 8 to 11, wherein the step of plasma treating comprises moving the single plasma nozzle and the identification document relative to one another to plasma treat the surface at a rate of at least about 1500 documents per hour.

Variant 13: The method of any one of variants 8 to 12, wherein the printer is a drop-on-demand printer, and the drop-on-demand printer prints on the surface using ultra-violet radiation curable ink.

Variant 14: The method of any one of variants 8 to 13, wherein the identification document comprises a plastic card that includes an integrated circuit chip; and further comprising reading data from and/or writing data to the integrated circuit chip.

Variant 15: The method of any one of variants 8 to 14, wherein the identification document comprises a plastic card that includes a magnetic stripe; and further comprising reading data from and/or writing data to the magnetic stripe.

Variant 16: A method of processing an identification document in an identification document printing system, comprising:
  in the identification document printing system, plasma treating a surface of the identification document using a plasma nozzle in a plasma treatment station while moving the plasma nozzle and the identification document relative to one another so that the surface is treated in a non-linear pattern;
  thereafter, inputting the identification document into a printer of the identification document printing system; and
  thereafter printing on the surface of the identification document using the printer.

Variant 17: The method of variant 16, wherein the non-linear pattern results from moving the plasma nozzle in a first direction and moving the identification document in a second direction.

Variant 18: The method of any one of variants 16 and 17, wherein the second direction is substantially perpendicular to the first direction.

Variant 19: The method of any one of variants claims 16 to 18, wherein the step of plasma treating comprises moving the plasma nozzle and the identification document relative to one another to plasma treat the surface at a rate of at least about 1500 documents per hour.

Variant 20: The method of any one of variants 16 to 19, wherein the printer is a drop-on-demand printer, and the drop-on-demand printer prints on the surface using ultra-violet radiation curable ink.

Variant 21: The method of any one of variants 16 to 20, wherein the identification document comprises a plastic card that includes an integrated circuit chip; and further comprising reading data from and/or writing data to the integrated circuit chip.

Variant 22: The method of any one of variants 16 to 21, wherein the identification document comprises a plastic card that includes a magnetic stripe; and further comprising reading data from and/or writing data to the magnetic stripe.

Variant 23: The method of any one of variants 16 to 22, wherein the non-linear pattern is a serpentine pattern.

Variant 24: A method of processing identification documents in an identification document printing system, comprising:
  in the identification document printing system, plasma treating a first surface of a first identification document using a plasma nozzle in a plasma treatment station while the plasma nozzle is located a first distance from the first surface;
  thereafter plasma treating the first surface of the first identification document or a second surface of a second identification document using the plasma nozzle in the plasma treatment station while the plasma nozzle is located a second distance from the first surface or from the second surface, where the second distance is greater than or less than the first distance.

Variant 25: A method of processing identification documents in an identification document printing system, comprising:
  in the identification document printing system, plasma treating a first surface of a first identification document using a first plasma stream from a plasma nozzle in a plasma treatment station, the plasma stream having a first intensity;
  thereafter plasma treating the first surface of the first identification document or a second surface of a second identification document using a second plasma stream from the plasma nozzle in the plasma treatment station, the second plasma stream having a second intensity, where the second intensity is greater than or less than the first intensity.

Variant 26: An identification document printing system, comprising:
  an identification document input that can hold a plurality of identification documents prior to printing, the identification documents having a width;
  an identification document output that can hold a plurality of identification documents that have been printed on;
  a plasma treatment station located between the identification document input and the identification document output, the plasma treatment station having an identification document travel path along which an identification document travels through the plasma treatment station;
  the plasma treatment station includes a plasma nozzle, the plasma nozzle is oriented toward the identification document travel path to discharge plasma onto a surface of an identification document, the plasma nozzle has a plasma discharge width that is less than the width of the identification document;
  the plasma nozzle is movable relative to the identification document travel path;
  a printer located between the identification document input and the identification document output; and
  an identification document transport system that transports identification documents between the identification document input, the plasma treatment station, the printer, and the identification document output.

Variant 27: The identification document printing system of variant 26, wherein the plasma treatment station has a treatment rate of at least about 1500 documents per hour.

Variant 28: The identification document printing system of any one of variants 26 to 27, further comprising a controller in communication with the plasma treatment station and the identification document transport system, wherein the controller controls the plasma treatment station and the identification document transport system so that the plasma nozzle and the identification document are moved relative to one another so that the surface is treated in a non-linear pattern.

Variant 29: The identification document printing system of any one of variants 26 to 28, wherein the non-linear pattern is a serpentine pattern.

Variant 30: The identification document printing system of any one of variants 26 to 29, wherein the printer is a drop-on-demand printer, and the drop-on-demand printer prints using ultra-violet radiation curable ink.

Variant 31: The identification document printing system of any one of variants 26 to 30, further comprising at least one of an integrated circuit chip station and a magnetic stripe station located between the identification document input and the identification document output.

Variant 32: A method of personalizing a plastic card comprising:
  plasma treating at least a portion of the surface of the plastic card using a moveable plasma nozzle to form a plasma treated surface; and
  printing personalized data on at least a portion of the plasma treated surface using a printer.

Variant 33: The method of variant 32, wherein the plasma nozzle is moveable in a direction that is substantially perpendicular to a travel path of the plastic card.

Variant 34: The method of any one of variants 32 to 33, wherein the plastic card includes an integrated circuit chip; and further comprising reading data from and/or writing data to the integrated circuit chip.

Variant 35: The method of any one of variants 32 to 34, wherein the printer is a drop-on-demand printer.

Variant 36: A method of pre-treating a surface of an identification document prior to performing printing on the surface, comprising:
  using a plasma nozzle to plasma treat at least a portion of the surface of the identification document while moving the relative positions of the surface and the plasma nozzle along a first and a second axis.

Variant 37: A method of pre-treating a surface of an identification document prior to performing printing on the surface comprising:
  moving the surface of the identification document in a second direction;
  moving a plasma nozzle in a first direction that is substantially perpendicular to the second direction; and
  plasma treating at least a portion of the surface of the identification document using a plasma stream discharged from the plasma nozzle.

Variant 38: A method of pre-treating a surface of an identification document prior to performing printing on the surface comprising:
  moving a plasma nozzle in a first direction and a second direction, where the second direction is substantially perpendicular to the first direction; and
  plasma treating at least a portion of the surface of the identification document using a plasma stream discharged from the plasma nozzle.

Variant 39: A method of pre-treating a surface of an identification document prior to performing printing on the surface comprising:
  moving the surface of the identification document in a first direction and a second direction, where the second direction is substantially perpendicular to the first direction; and
  plasma treating at least a portion of the surface of the identification document using a plasma stream discharged from a plasma nozzle.

Variant 40: A plastic card or passport page, comprising:
  a surface having a plasma treated portion and a non-plasma treated portion, the plasma treated portion and the non-plasma treated portion at least partially border one another.

Variant 41: The plastic card or the passport page of variant 40, wherein the surface includes a plurality of plasma treated portions, and the non-plasma treated portion borders on at least two of the plurality of plasma treated portions.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A plastic card or passport page printing system, comprising:
  an input that can hold a plurality of plastic cards or passport pages prior to printing, the plastic cards and the passport pages having a width;
  a plasma treatment station located downstream from the input, the plasma treatment station having a plastic card or passport page travel path along which one of the plastic cards or one of the passport pages travels through the plasma treatment station;
  the plasma treatment station includes a plasma nozzle, the plasma nozzle is oriented toward the travel path to discharge plasma onto a surface of one of the plastic cards or one of the passport pages, the plasma nozzle has a plasma discharge width that is less than the width of the plastic cards or the passport pages;
  the plasma nozzle is configured to move, during plasma treatment, relative to the travel path in a direction that is perpendicular to a direction of travel of the plastic cards or the passport pages along the travel path; and
  a printer located downstream of the input.

2. The plastic card or passport page printing system of claim 1, wherein the plasma treatment station is configured to have a treatment rate of at least about 1500 documents per hour.

3. The plastic card or passport page printing system of claim 1, wherein the printer is a drop-on-demand printer, and the drop-on-demand printer prints using ultra-violet radiation curable ink; and further comprising at least one of an integrated circuit chip station and a magnetic stripe station located downstream of the input.

4. The plastic card or passport page printing system of claim 1, wherein the plasma nozzle is configured to move, during plasma treatment, in a direction that is parallel to the surface and/or the plasma nozzle is configured to move, while discharging plasma during treatment, in a direction toward or away from the surface to alter the distance between the plasma nozzle and the surface.

5. The plastic card or passport page printing system of claim 1, wherein:
  the plasma treatment station includes a single plasma nozzle;
  the single plasma nozzle is configured to move during plasma treatment in a direction toward or away from the surface to alter the distance between the single plasma nozzle and the surface.

6. The plastic card or passport page printing system of claim 5, wherein the plastic cards or the passport pages are movable in forward and reverse directions along the travel path in the plasma treatment station, and the single plasma nozzle is configured to move in forward and reverse directions perpendicular to the direction of travel of the plastic cards or passport pages along the travel path.

7. The plastic card or passport page printing system of claim 1, further comprising a controller operatively connected to the plasma treatment station to control movement of the plasma nozzle.

8. The plastic card or passport page printing system of claim 1, further comprising a transport system that transports the plastic cards or the passport pages between the input, the plasma treatment station, and the printer.

9. A plastic card or passport page printing system, comprising:
an input that can hold a plurality of plastic cards or passport pages prior to printing, the plastic cards and the passport pages having a width;
a plasma treatment station located downstream from the input, the plasma treatment station having a plastic card or passport page travel path along which one of the plastic cards or one of the passport pages travels through the plasma treatment station;
the plasma treatment station includes a plasma nozzle, the plasma nozzle is oriented toward the travel path to discharge plasma onto a surface of one of the plastic cards or one of the passport pages, the plasma nozzle has a plasma discharge width that is less than the width of the plastic cards or the passport pages;
the plasma nozzle is mounted so as to permit movement thereof relative to the travel path in a direction that is perpendicular to a direction of travel of the plastic cards or the passport pages along the travel path;
a controller operatively connected to the plasma treatment station to control movement of the plasma nozzle in the direction that is perpendicular to the direction of travel of the plastic cards or the passport pages along the travel path; and
a printer located downstream of the input.

10. The plastic card or passport page printing system of claim 9, wherein the plasma treatment station is controlled by the controller to have a treatment rate of at least about 1500 documents per hour.

11. The plastic card or passport page printing system of claim 9, wherein the printer is a drop-on-demand printer, and the drop-on-demand printer prints using ultra-violet radiation curable ink; and further comprising at least one of an integrated circuit chip station and a magnetic stripe station located downstream of the input.

12. The plastic card or passport page printing system of claim 9, wherein the plasma nozzle is controllable by the controller so as to be moveable in a direction that is parallel to the surface and/or the plasma nozzle is controllable by the controller so as to be moveable in a direction toward or away from the surface to alter the distance between the plasma nozzle and the surface.

13. The plastic card or passport page printing system of claim 9, wherein:
the plasma treatment station includes a single plasma nozzle;
the single plasma nozzle is controllable by the controller so as to be moveable during plasma treatment in a direction toward or away from the surface to alter the distance between the single plasma nozzle and the surface.

14. The plastic card or passport page printing system of claim 13, wherein the plastic cards or the passport pages are movable in forward and reverse directions along the travel path in the plasma treatment station, and the single plasma nozzle is controllable by the controller so as to be moveable in forward and reverse directions perpendicular to the direction of travel of the plastic cards or passport pages along the travel path.

15. The plastic card or passport page printing system of claim 9, further comprising a transport system that transports the plastic cards or the passport pages between the input, the plasma treatment station, and the printer.

* * * * *